US010409922B2

(12) United States Patent
Srinivasan et al.

(10) Patent No.: US 10,409,922 B2
(45) Date of Patent: Sep. 10, 2019

(54) NAVIGATING AND AUTHORING CONFIGURED PRODUCT LIFECYCLE DATA

(71) Applicant: Siemens Product Lifecycle Management Software Inc., Plano, TX (US)

(72) Inventors: Krishnan Srinivasan, Plano, TX (US); Charubrata Ray, Pune (IN); Girish Kandi, Pune (IN); Nitin Goyal, Jwalapur (IN)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 1009 days.

(21) Appl. No.: 14/535,844

(22) Filed: Nov. 7, 2014

(65) Prior Publication Data

US 2015/0356211 A1 Dec. 10, 2015

(30) Foreign Application Priority Data

Jun. 10, 2014 (IN) .............................. 632/KOL/2014

(51) Int. Cl.
*G06F 17/50* (2006.01)
(52) U.S. Cl.
CPC ................................ *G06F 17/5004* (2013.01)
(58) Field of Classification Search
None
See application file for complete search history.

(56) References Cited

U.S. PATENT DOCUMENTS

| 5,995,961 | A * | 11/1999 | Levy | G06F 17/30433 |
| 6,278,991 | B1 * | 8/2001 | Ebert | G06F 17/30873 |
| 8,412,741 | B2 | 4/2013 | Hein | |
| 2003/0042316 | A1 * | 3/2003 | Teraura | G06K 19/0723 |
| | | | | 235/487 |
| 2003/0110172 | A1 * | 6/2003 | Selman | G06F 17/30581 |
| 2005/0004831 | A1 * | 1/2005 | Najmi | G06Q 10/06 |
| | | | | 705/7.22 |

(Continued)

FOREIGN PATENT DOCUMENTS

| CN | 102651102 A | 8/2012 |
| CN | 103502976 A | 1/2014 |
| WO | 2014/052037 A1 | 4/2014 |

OTHER PUBLICATIONS

PCT Search Report dated Aug. 31, 2015, for Application No. PCT/US2015/034616, 12 pages.

(Continued)

*Primary Examiner* — Craig C Dorais (57) ABSTRACT

Methods for product data management and corresponding systems and computer-readable mediums. The systems and methods include receiving a request for expanded details about an architecture element of a model from an application client, parsing the request to identify the expanded details of the architecture element, identifying a structure and configuration details of the model, configuring the model according to the structure and configuration details, traversing the model to collect the expanded details for the architecture element, packaging the expanded details into an application format for the client, and returning the expanded details.

17 Claims, 7 Drawing Sheets

(56) References Cited

U.S. PATENT DOCUMENTS

| | | |
|---|---|---|
| 2006/0173953 A1 | 8/2006 | Salzsauler |
| 2008/0004831 A1 | 1/2008 | Li |
| 2008/0091942 A1 | 4/2008 | Glatfelter et al. |
| 2009/0312860 A1 | 12/2009 | Beucker et al. |
| 2010/0105449 A1 | 4/2010 | Shi et al. |
| 2012/0105449 A1* | 5/2012 | Buchowski ............. G06T 19/20 345/420 |
| 2012/0271596 A1 | 10/2012 | Hadley et al. |
| 2012/0278046 A1 | 11/2012 | Srinivasan et al. |
| 2013/0061174 A1 | 3/2013 | Buchanan et al. |
| 2014/0012547 A1 | 1/2014 | Mattson et al. |
| 2014/0019112 A1* | 1/2014 | Canedo ............... G06F 17/5009 703/21 |

OTHER PUBLICATIONS

EP Search Report dated Jan. 26, 2018, for EP Application No. 15807448.4, 10 pages.

* cited by examiner

NAVIGATING AND AUTHORING CONFIGURED PRODUCT LIFECYCLE DATA

CROSS-REFERENCE TO OTHER APPLICATION

This application claims the benefit of the filing date of India Patent Application 632/KOL/2014, filed Jun. 10, 2014, which is hereby incorporated by reference.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include systems and methods enabling a diagrammatic approach to navigating and authoring configured product life cycle data and other PDM data. The method includes receiving a request for expanded details about an architecture element of a model from an application client, parsing the request to identify the expanded details of the architecture element, identifying a structure and configuration details of the model, configuring the model according to the structure and configuration details, traversing the model to collect the expanded details for the architecture element, packaging the expanded details into an application format for the client, and returning the expanded details.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

A large and complex system such as an automobile needs a rich and flexible modeling system to capture the various life cycle stages of the system. A product goes through its initial definition stages of requirement development and functional analysis and then though logical modeling of the system (R-F-L stages). Each stage of product development involves capturing various aspects of the product and its dependencies. An engineer often must know the impact of modifying a design on not only on other subsystems but also should know impact on requirements and functional aspects of the system. Disclosed embodiments include systems and methods for graphically navigating and authoring requirement, functional, logical, and physical (RFLP) architectures of the system. Disclosed embodiments provide a mechanism to perform impact analysis across the life cycle in an easy to use diagrammatic way that can span hundreds of thousands of objects.

Disclosed embodiments provide a high performance and scalable architecture for navigating and creating very large RFLP models in environments. Disclosed embodiments include an intuitive and easy to use application for graphically navigating large vehicle models, and seamless integration for different product structure technologies such as with bill of materials (BOM) and Index BOM.

Customers today struggle with managing large product data stored in various systems and databases and have an easy to use and intuitive way to navigate and author information. Disclosed embodiments provide customers the ability to perform impact analysis at various stages of product development and avoid costly mistakes.

Disclosed embodiments enable users to navigate and author a configured product that spans all life cycle stages in a single diagram. A user need not have created the diagram manually and disclosed systems and methods can automatically create the diagram from saved product data.

Figure 1:
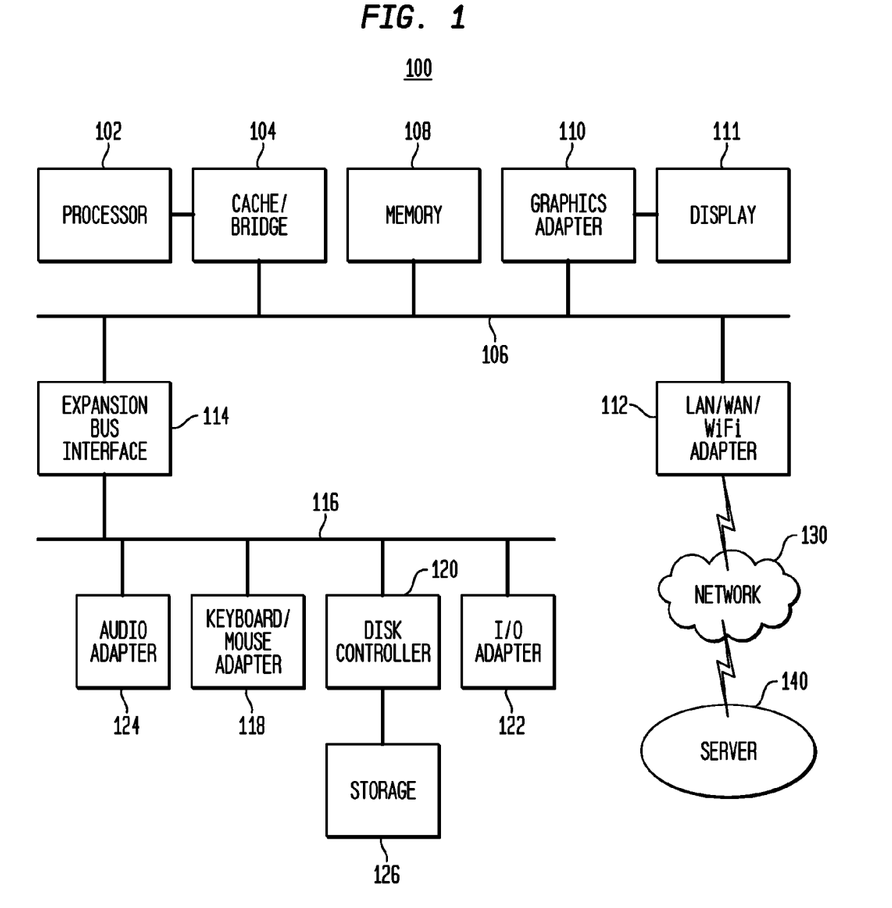
FIG. 1 illustrates a block diagram of a data processing system in which an embodiment can be implemented.

FIG. 1 illustrates a block diagram of a data processing system in which an embodiment can be implemented, for example as a PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments include systems and methods for implementing a diagrammatic way to view, navigate, create, and edit the RFLP architectural design information for a product giving users the real-time, navigable big picture for understanding and managing all aspects of the product lifecycle. Disclosed embodiments go beyond just generating and authoring a diagram, and also include using diagrams to deliver status information and collaborating through a diagrammatic way of presenting product lifecycle information.

Customers need a way to organize the information of artifacts of the various lifecycle stages of the product such as RFLP. Even though it can vary between customers and industries, customer can use a common definition of a product or program. Under this product or program node, they organize the various structures that define the content.

Figure 2:
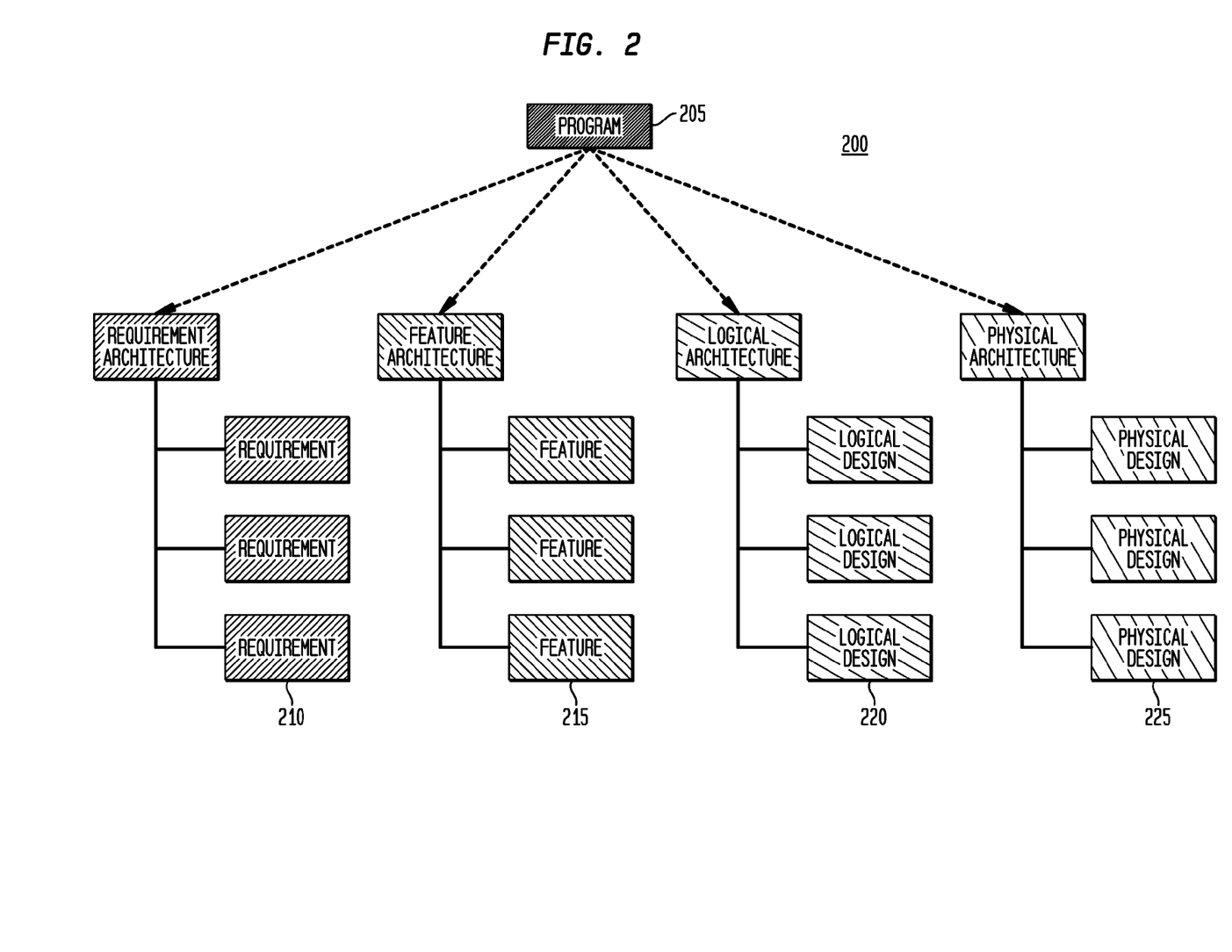
FIG. 2 illustrates a structure of the various lifecycle stages of a program in which in accordance with disclosed embodiments.

FIG. 2 illustrates a structure 200 of the various lifecycle stages of a program in accordance with disclosed embodiments.

The structure 200 provides organization for information of artifacts of the lifecycles stages of a program or product 205. Typical lifecycle stages include requirement, feature, logical and physical. The structure 200 organizes the requirement elements 210, feature elements 215, logical elements 220, and physical elements 225 into respective architectures. The requirement architecture can be implemented by requirement specification class. The feature architecture can be implemented by a subclass of a functionality class. The logical architecture can be implemented by a subclass seg0LogicalBlock class.

Figure 3:
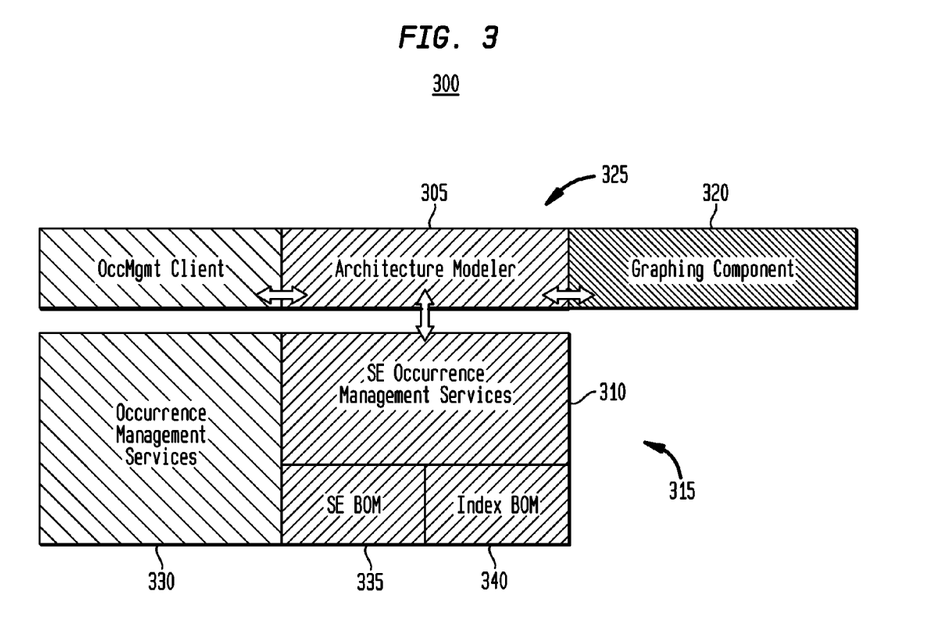
FIG. 3 illustrates a design of a system of the architecture modeler in accordance with disclosed embodiments.

FIG. 3 illustrates a design of a system 300 of the architecture modeler 305 in accordance with disclosed embodiments. The architecture modeler 305 performs the architecture modeling and RFLP use cases. The architecture modeler 305 works with the system engineering occurrence management services (SEOccMgmt) 310 component in the application server 315 to create and navigate system engineering (SE) objects and the graph component 320 in the application client 325 to draw them. Note that while specific names are used herein to describe certain modules or components, these name are non-limiting and other names can be used for elements that operate as described.

The graph component 320 is a system component responsible for converting application data fetched from an application server 315, such as a Teamcenter server, by each application client 325 to a graphing component 320 that can be drawn and manipulated. Teamcenter is a product of Siemens Product Lifecycle Management Software Inc. (Plano, Tex.).

The occurrence management services 330 component provides the services to manage occurrence of objects in the diagramming. The SEOccMgmt 310 includes representation of the occurrence object, services to set product context for navigation, showing bread crumb, retrieving instances, etc.

A SEOccMgmt 310 component provides application data model for exposing systems engineering features in a modeling environment and provides the application programming interface (API) to access the modeling environment. The SEOccMgmt 310 also provides hook points for calling services from different SE implementations (BOM 335, indexed representation 340) through adapter patterns.

The application server 315 can send the application data in a form that can be consumed by any number of user interface (UI) constructs. For example, a simple SE Structure (logical assembly comprising ports connected by a connection) can be consumed by a diagramming application or a table widget. The application server 315 sends data in a generic way that can be consumed by any number of widgets or application, which makes the service-oriented architecture (SOA) usable across many applications or UI widgets.

Figure 4:
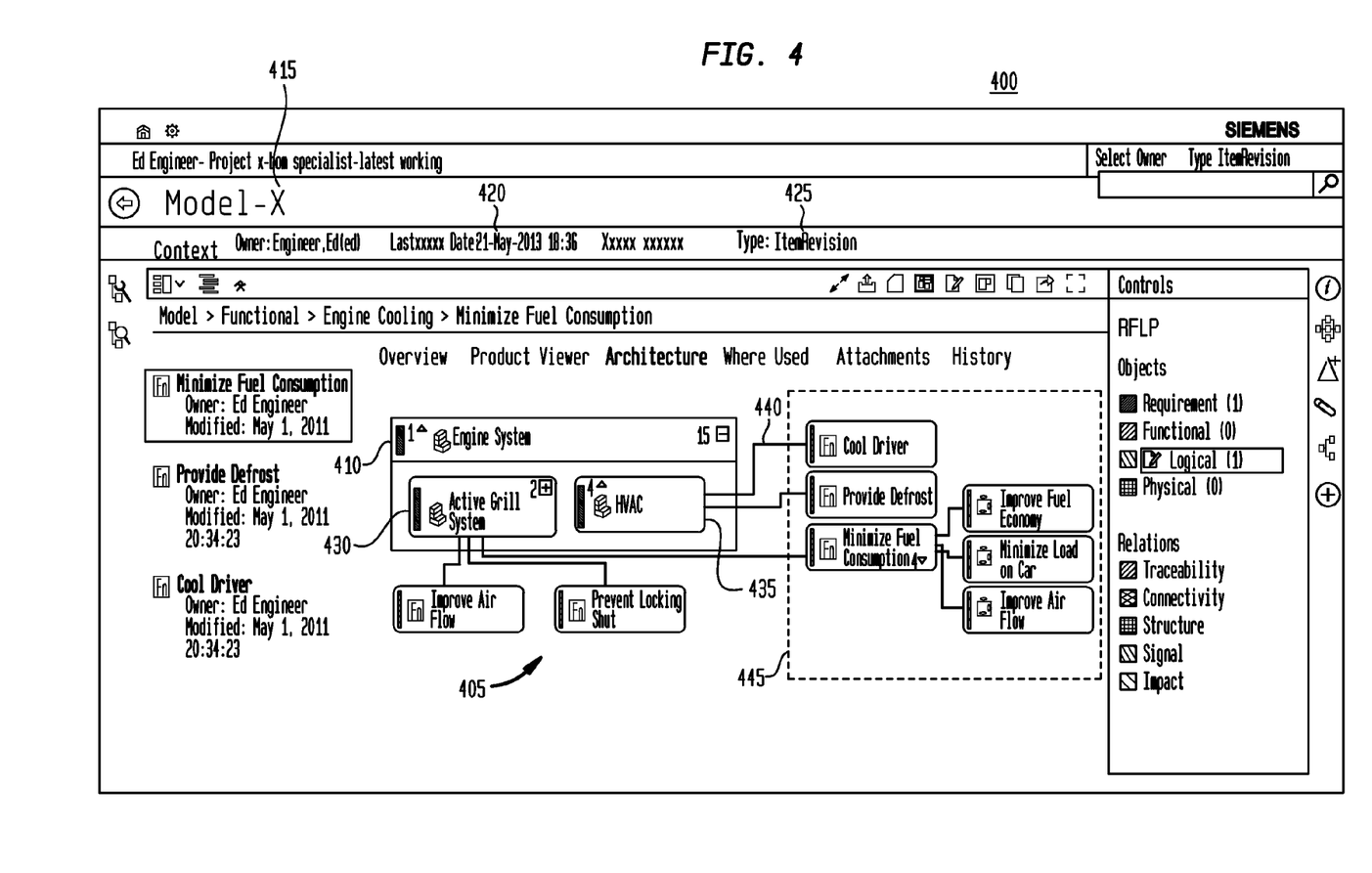
FIG. 4 illustrates a user interface containing a model using an architecture modeler in accordance with disclosed embodiments.

FIG. 4 illustrates a user interface 400 containing a model 405 using an architecture modeler in accordance with disclosed embodiments.

The architecture modeler uses the concept of "program" to navigate various structures and relations between them. The architecture modeler provides a user interface 400 for users to filter the relations and types of architecture elements 410 pursuant to one or more users' interests or requirements.

Since the structure represents organization of engineering content, an item based architecture element 410 capturing the content will be sufficient in various embodiments. The content of the structure can be another level of architecture elements 410 or the design content.

The architecture modeler organizes the architecture elements 410 of a model 405. Different versions of the model 405 can be accessed through the architecture modeler based on configuration details 415 including model year 420 and model package 425.

The architecture elements 410 contain information about subsystems 430, ports 435 on the architecture elements 410, connections 440 between architecture elements 410 and other expanded details 445.

Figure 5:
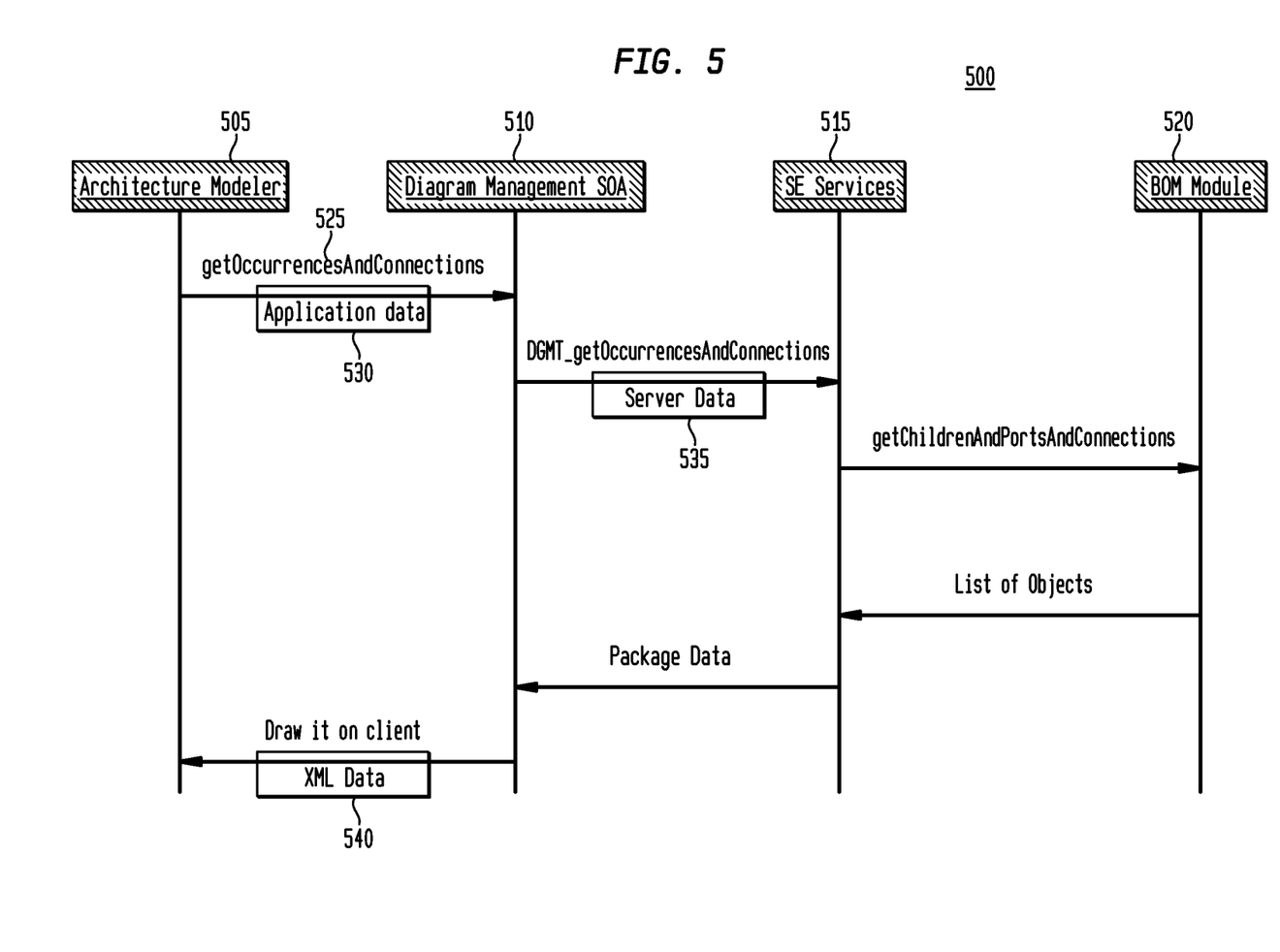
FIG. 5 illustrates a diagram of a server system in accordance with disclosed embodiments.

FIG. 5 illustrates a diagram of a server system 500 in accordance with disclosed embodiments. The server system 500 comprises an architecture modeler 505, a diagram management SOA 510, SE services 515, and a BOM module 520.

The server system 500 displays a logical element, for example an exhaust system, by searching for the logical element by name and displaying logical element in the architecture modeler 505, the application client or web client. To see the inner working of the exhaust system, an expand button on the logical element in the application client is selected. The architecture modeler 505 sends a request 525 to the server for expanded details about the exhaust system.

The diagram management SOA 510 on the server parses the request 525 received from the application client and identifies details of the request 525 such as what element needs to be expanded. The diagram management SOA 510 is a data transfer layer for converting the application data 530 from the application client to server data 535.

The SE Services 515 identifies the nature of the data the user has displayed in the architecture modeler 505. The SE Services 515 provides customers various ways to model the data such as traditional bill of material representation, indexed representation of the same data for faster performance, etc. The SE Services 515 also identifies the configuration details of the data displayed in the architecture modeler 505, such as, whether the user is looking at the exhaust system of 2016 model of a vehicle or earlier version and whether it is a deluxe version or the luxury version of the model. It then communicates the details of the request 525 to the BOM module 520.

The BOM module 520 configures a fully configured model of the appropriate version of the exhaust system based on the data requested and the details provided. The BOM module 520 then navigates the details of the exhaust system and returns an appropriate set of information requested by the application client such as immediate sub system of the exhaust system, the ports on the components and the connections between them. Because the BOM module 520 is used by number of application clients, for example a web client, a rich client, customization done by customers and so on, the BOM module 520 does not package the data.

The SE Services 515 gathers the information from the BOM Module and packages the information as needed by the architecture modeler 505 and returns the information to Diagram Management SOA 510. The Diagram Management SOA 510 then converts the server data 535 to XML data 540 to be returned over the network to the application client.

The architecture modeler 505 receives the information from the server and uses the XML data 540 to draw the expanded details on the user interface.

Figure 6:
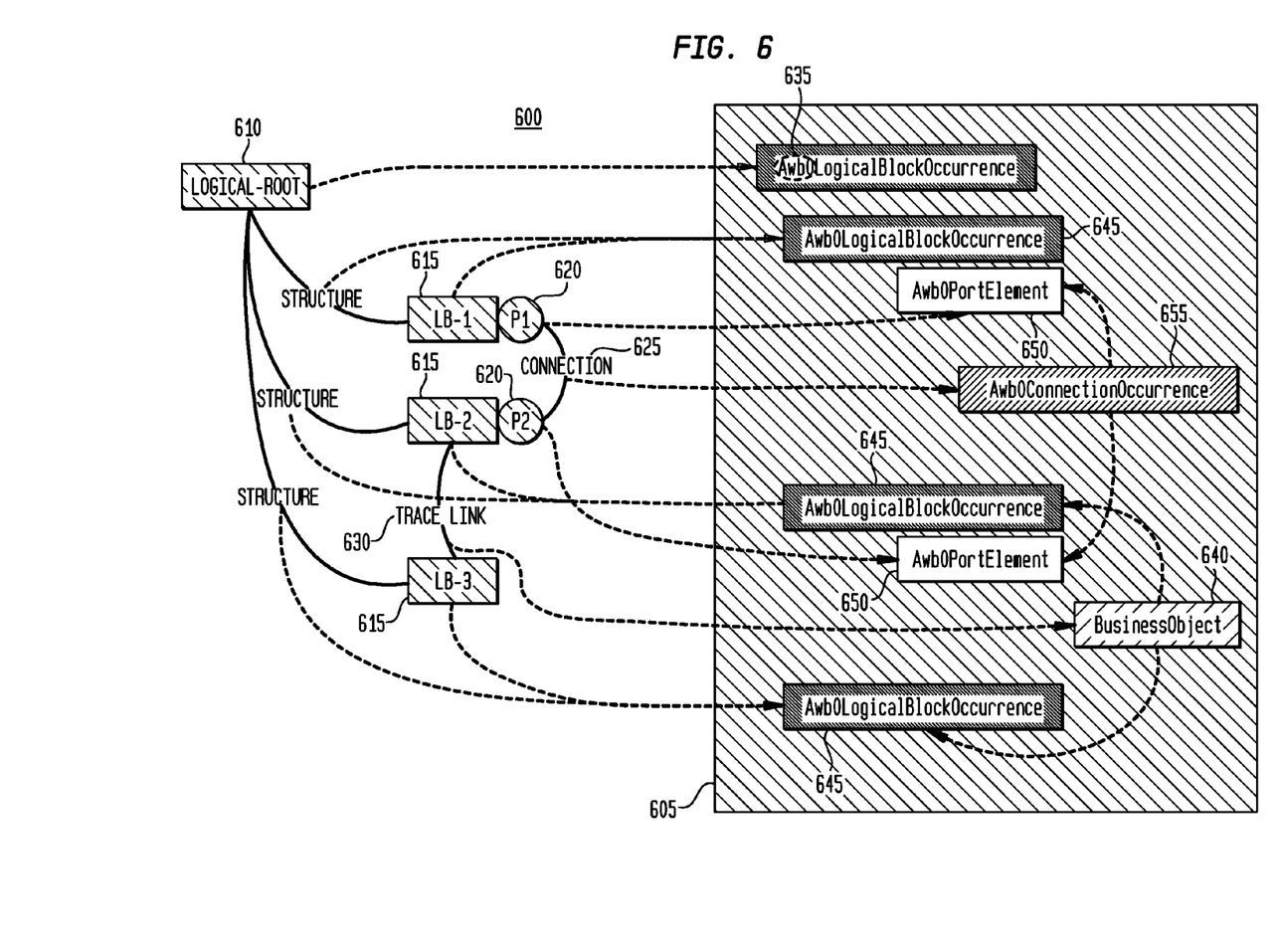
FIG. 6 illustrates a data exchange from server to application client in accordance with disclosed embodiments.

FIG. 6 illustrates a data exchange 600 from the server to an application format 605 in accordance with disclosed embodiments.

The parent occurrence 610 is the element root for the data exchange 600. The parent occurrence 610 can include a plurality of child occurrences 615. The child occurrences 615 can include port occurrences 620, which relate the child occurrence 615 to other child occurrences 615 through a connection 625. The child occurrences 615 and port occurrences 620 will use the "awb0parent" data member 635 that is inherited from Awb0Element class to represent of the parent occurrence 610. The child occurrences 615 can also be related through tracelinks 630. The tracelinks 630 between objects are implemented as business objects 640. The system applies presentation and style rules and draws the objects on the canvas as nodes and edges.

The parent occurrences 610 and the child occurrences 615 are represented by block occurrences 645 in the application format 605. The port occurrences 620 are represented by port elements 650 for the block occurrences 645. The connections 625 are represented by connection occurrences 655, which can be an edge in the application format 605.

Figure 7:
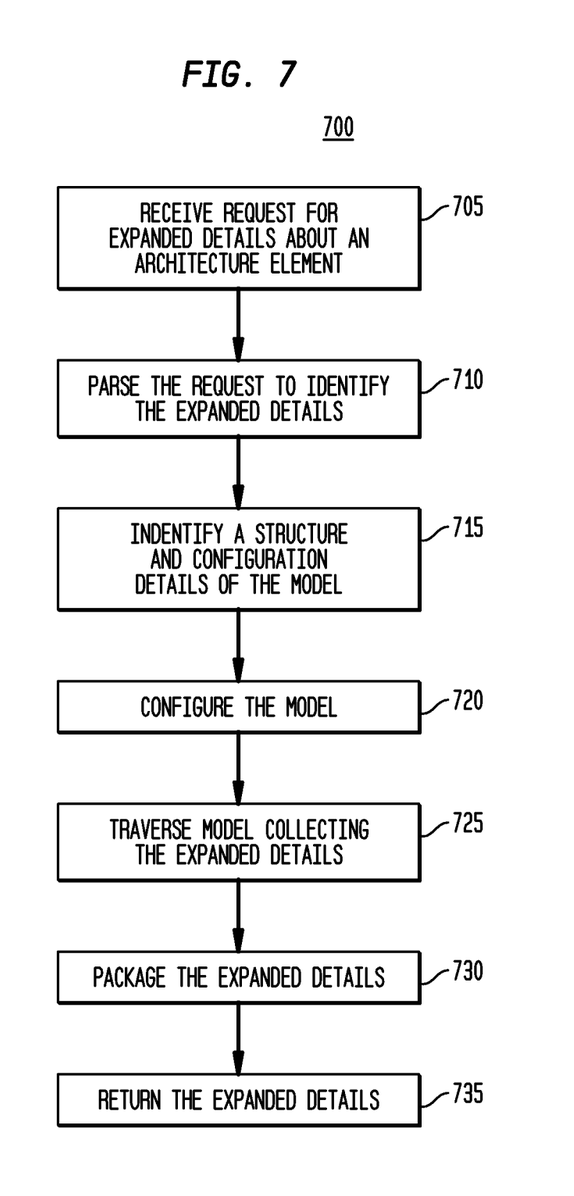
FIG. 7 illustrates a flowchart of navigating and authoring configured product life cycle data in accordance with disclosed embodiments.

FIG. 7 illustrates a flowchart of navigating and authoring configured product life cycle data 700 in accordance with disclosed embodiments.

In step 705, the system receives a request for expanded details about an architecture element of a model from an application client. The architecture modeler, application client, transmits a request to the server for expanded details about an architecture element. Example of architecture elements include, but are not limited to, requirement elements, feature elements, logical elements, or physical elements.

In step 710, the system parses the request to identify the expanded details of the model. The diagram management SOA on the server parses the request from the application client and identifies details of the request such as what element needs to be expanded. The diagram management SOA is a data transfer layer for converting the application data from the application client to server data.

In step 715, the system identifies a structure and configuration details of the model. The SE Services identifies the nature of the data the user has displayed in the architecture modeler and provides customers various ways to model the data, such as, traditional bill of material representation, indexed representation of the same data for faster performance, etc. The SE Services also identifies the configuration details of the data displayed in the architecture modeler, such as, whether the user is looking at a specific model of a vehicle.

In step 720, the system configures the model according to the structure and configuration details. The BOM module configures a fully configured model of the appropriate version of the model based on the data requested and the details provided.

In step 725, the system traverses the model to collect the expanded details for the architecture element. The BOM module navigates the details of the model and returns an appropriate set of information requested by the application client, such as subsystems of the model, the ports on the components, and the connections between components.

In step 730, the system packages the expanded details into an application format for the application client. The SE Services packages the information gathered from the BOM Module as needed by the architecture modeler and returns the information to Diagram Management SOA. The Diagram Management SOA then converts the server data to XML data or other application format to be returned over the network to the application client.

In step 735, the system returns the expanded details for the architecture element to the application client. The architecture modeler receives the information from the server and uses the XML data to draw the expanded details on the user interface.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC § 112(f) unless the exact words "means for" are followed by a participle.

What is claimed is:

1. An application server comprising:
a network adapter configured to communicate with an application client;
an accessible memory configured to store server data; and
a processor operably coupled to the network adapter and the accessible memory, the processor configured to:
receive a request for expanded details about an architecture element of a model from the application client;
parse the request to identify the expanded details for a plurality of subsystems in the architecture element;
identify a structure and configuration details of the model stored in the server data;
configure the model according to the structure and configuration details, wherein the model includes a requirement development stage, a functional analysis stage, and a logical modeling stage;
data traverse the model to collect the expanded details for the plurality of subsystems in the architecture element, wherein the expanded details comprise ports on the architecture element, and connections between architecture elements;
package the expanded details by converting the server data into an application format for the application client; and
return the packaged expanded details to the application client,
wherein the application client incorporates the expanded details for the plurality of subsystems in the architecture element into a single diagram including the requirement development stage, the functional analysis stage, and the logical modeling stage.

2. The application server of claim 1, wherein the architecture element of a model comprises one of a requirement element, a feature element, a logical element, or a physical element.

3. The application server of claim 1, wherein the structure of the model comprises one of a bill of materials or an indexed representation.

4. The application server of claim 1, wherein the configuration details comprise model year and model package.

5. The application server of claim 1, wherein to parse the request comprises converting application data of the request to server data.

6. An application server comprising:
a network adapter configured to communicate with an application client;
an accessible memory configured to store server data; and
a processor operably coupled to the network adapter and the accessible memory, the processor configured to:
receive a request for expanded details about an architecture element of a model from the application client;

parse the request to identify the expanded details for a plurality of subsystems in the architecture element;
identify a structure and configuration details of the model stored in the server data;
configure the model according to the structure and configuration details, wherein the model includes a requirement development stage, a functional analysis stage, and a logical modeling stage;
data traverse the model to collect the expanded details for the plurality of subsystems in the architecture element;
package the expanded details by converting the server data into an application format for the application client, wherein the application format an XML data format; and
return the packaged expanded details to the application client,
wherein the application client incorporates the expanded details for the plurality of subsystems in the architecture element into a single diagram including the requirement development stage, the functional analysis stage, and the logical modeling stage.

7. A method for navigating and authoring configured product lifecycle data of a product data management (PDM) system, the method performed by an application server and comprising:
receiving a request for expanded details about an architecture element of a model from an application client;
parsing the request to identify the expanded details for a plurality of subsystems in the architecture element;
identifying a structure and configuration details of the model stored in server data;
configuring the model according to the structure and configuration details, wherein the model includes a requirement development stage, a functional analysis stage, and a logical modeling stage;
data traversing the model to collect the expanded details for the plurality of subsystems in the architecture element, wherein the expanded details comprise ports on the architecture element, and connections between architecture elements;
packaging the expanded details by converting the server data into an application format for the application client; and
return the packaged expanded details to the application client,
wherein the application client incorporates the expanded details for the plurality of subsystems in architecture element into a single diagram including the requirement development stage, the functional analysis stage, and the logical modeling stage.

8. The method of claim 7, wherein the architecture element of a model comprises one of a requirement element, a feature element, a logical element, or a physical element.

9. The method of claim 7, wherein the structure of the model comprises one of a bill of materials or an indexed representation.

10. The method of claim 7, wherein the configuration details comprise model year and model package.

11. The method of claim 7, wherein to parse the request comprises converting application data of the request to server data.

12. A method for navigating and authoring configured product lifecycle data of a product data management (PDM) system, the method performed by an application server and comprising:

receiving a request for expanded details about an architecture element of a model from an application client;
parsing the request to identify the expanded details for a plurality of subsystems in the architecture element;
identifying a structure and configuration details of the model stored in server data;
configuring the model according to the structure and configuration details, wherein the model includes a requirement development stage, a functional analysis stage, and a logical modeling stage;
data traversing the model to collect the expanded details for the plurality of subsystems in the architecture element;
packaging the expanded details by converting the server data into an application format for the application client, wherein the application format is an XML data format; and
return the packaged expanded details to the application client,
wherein the application client incorporates the expanded details for the plurality of subsystems in architecture element into a single diagram including the requirement development stage, the functional analysis stage, and the logical modeling stage.

13. A non-transitory computer-readable medium encoded with executable instructions that, when executed, cause one or more data processing systems to perform the steps of:
receiving a request for expanded details about an architecture element of a model from an application client;
parsing the request to identify the expanded details for a plurality of subsystems in the architecture element;
identifying a structure and configuration details of the model stored in server data;
configuring the model according to the structure and configuration details, wherein the model includes a requirement development stage, a functional analysis stage, and a logical modeling stage;
data traversing the model to collect the expanded details for the plurality of subsystems in the architecture element, wherein the expanded details comprise ports on the architecture element, and connections between architecture elements;
packaging the expanded details by converting the server data into an application format for the application client; and
returning the packaged expanded details to the application client,
wherein the application client incorporates the expanded details for the plurality of subsystems in the architecture element into a single diagram including the requirement development stage, the functional analysis stage, and the logical modeling stage.

14. The computer-readable medium of claim 13, wherein the architecture element of a model comprises one of a requirement element, a feature element, a logical element, or a physical element.

15. The computer-readable medium of claim 13, wherein the structure of the model comprises one of a bill of materials or an indexed representation.

16. The computer-readable medium of claim 13, wherein the configuration details comprise model year and model package.

17. A non-transitory computer-readable medium encoded with executable instructions that, when executed, cause one or more data processing systems to perform the steps of:
receiving a request for expanded details about an architecture element of a model from an application client;

parsing the request to identify the expanded details for a plurality of subsystems in the architecture element;
identifying a structure and configuration details of the model stored in server data;
configuring the model according to the structure and configuration details, wherein the model includes a requirement development stage, a functional analysis stage, and a logical modeling stage;
data traversing the model to collect the expanded details for the plurality of subsystems in the architecture element;
packaging the expanded details by converting the server data into an application format for the application client, wherein the application format is an XML data format; and
returning the packaged expanded details to the application client,
wherein the application client incorporates the expanded details for the plurality of subsystems in the architecture element into a single diagram including the requirement development stage, the functional analysis stage, and the logical modeling stage.

* * * * *